United States Patent
Black et al.

(10) Patent No.: US 8,189,198 B2
(45) Date of Patent: May 29, 2012

(54) ACTIVE VIEWPORT DETECTION ASSEMBLY FOR SUBSTRATE DETECTION IN A VAPOR DETECTION SYSTEM

(75) Inventors: Russell Weldon Black, Longmont, CO (US); Mark Jeffrey Pavol, Arvada, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 372 days.

(21) Appl. No.: 12/638,713

(22) Filed: Dec. 15, 2009

(65) Prior Publication Data

US 2011/0141473 A1   Jun. 16, 2011

(51) Int. Cl.
*G01N 21/84* (2006.01)
(52) U.S. Cl. ...................................... 356/429
(58) Field of Classification Search ........... 356/429–430
See application file for complete search history.

(56) References Cited

U.S. PATENT DOCUMENTS

| | | | |
|---|---|---|---|
| RE27,930 E | * | 2/1974 | House ........................ 427/250 |
| 5,129,994 A | | 7/1992 | Ebbing et al. |
| 5,230,556 A | * | 7/1993 | Canty et al. .................. 362/562 |
| 5,304,499 A | | 4/1994 | Bonnet et al. |
| 5,977,526 A | | 11/1999 | Mattord et al. |
| 6,367,415 B2 | | 4/2002 | Kim et al. |
| 6,423,565 B1 | | 7/2002 | Barth et al. |
| 6,444,043 B1 | | 9/2002 | Gegenwart et al. |
| 2009/0194165 A1 | | 8/2009 | Murphy et al. |

* cited by examiner

*Primary Examiner* — Michael P Stafira
(74) *Attorney, Agent, or Firm* — Dority & Manning, P.A.

(57) ABSTRACT

An active viewport assembly for use in detecting substrates conveyed through a vapor deposition system includes a casing configured for mounting to a wall of a vapor deposition module. The casing further includes an enclosed chamber, an exterior side port, and an interior side port. A lens assembly is disposed within the chamber and extends through the interior side port. A heater element is configured on the lens assembly within the chamber. One of an active transmitter or an active signal receiver is configured with the exterior side port external of the chamber and is axially aligned with and spaced from the lens assembly.

16 Claims, 3 Drawing Sheets

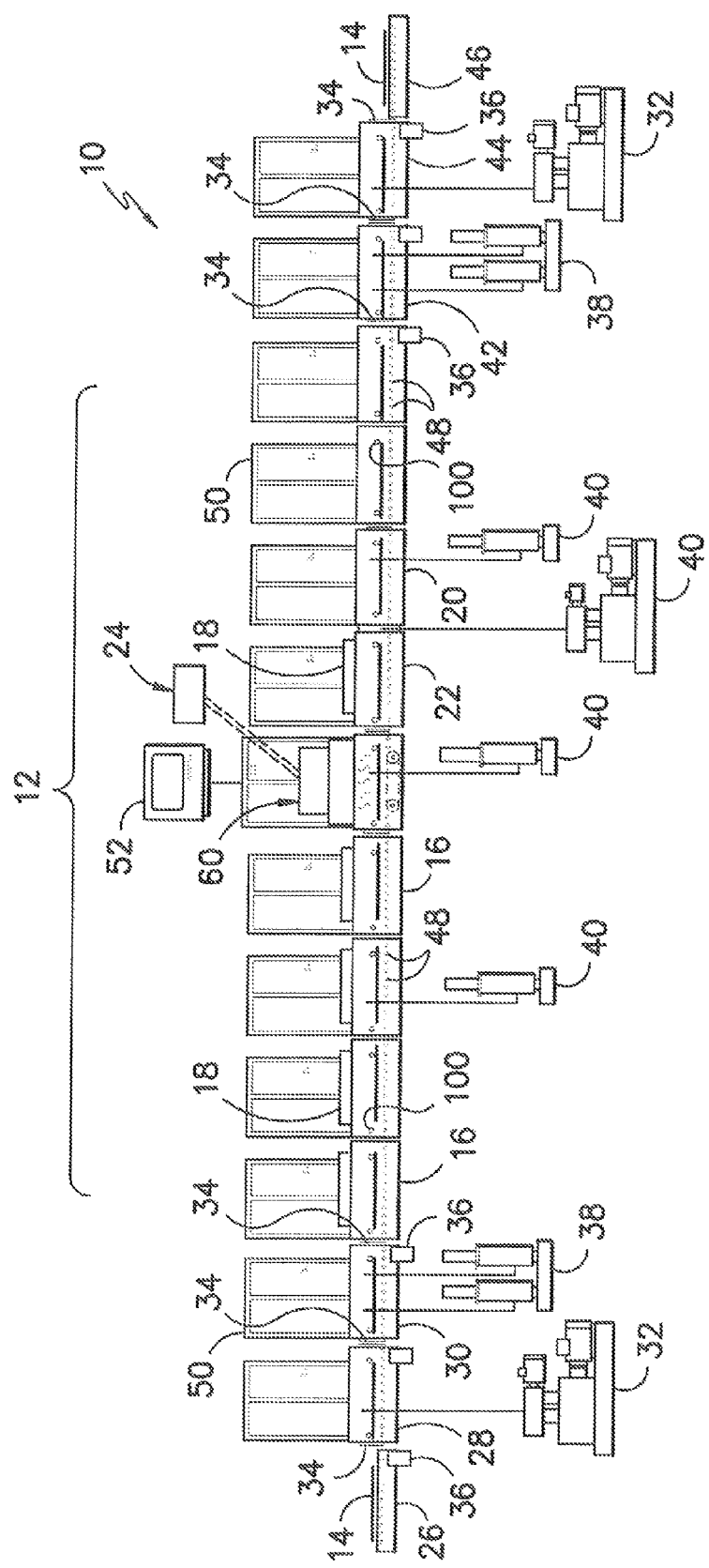
FIG. -1-

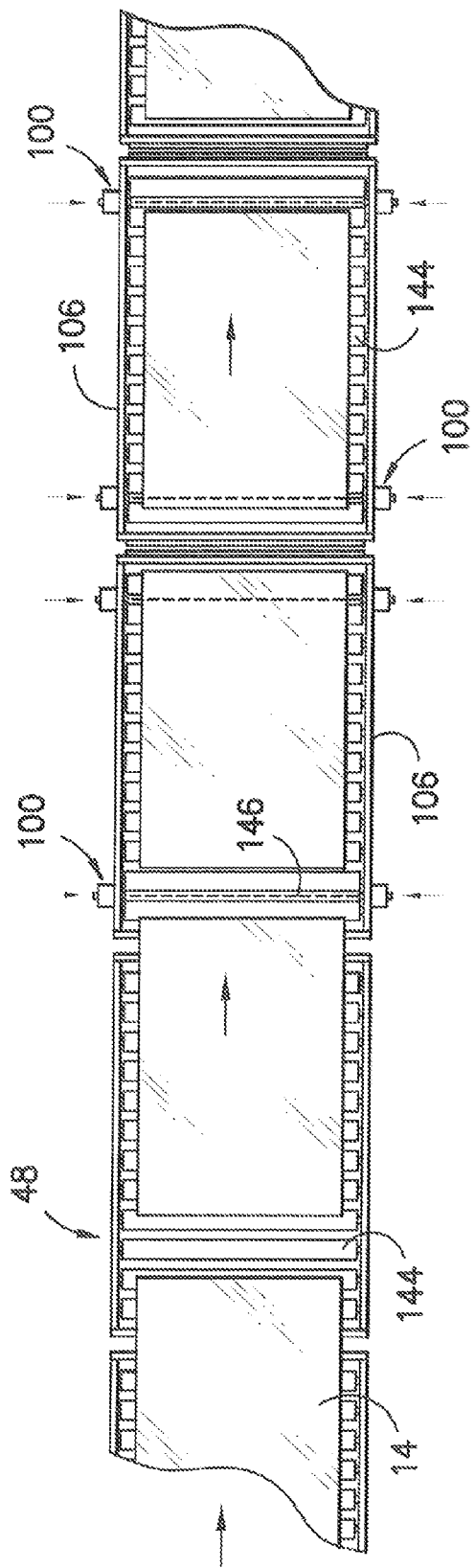
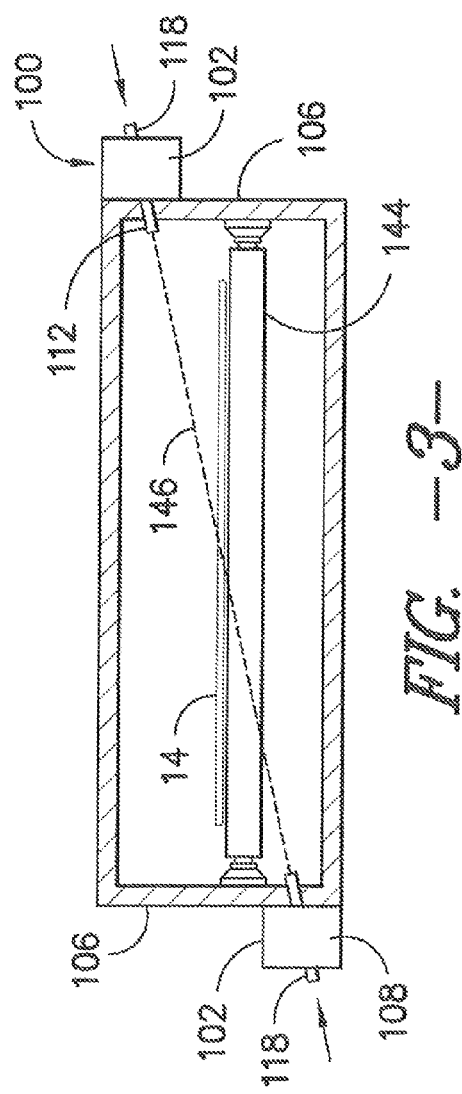
FIG. -2-
FIG. -3-

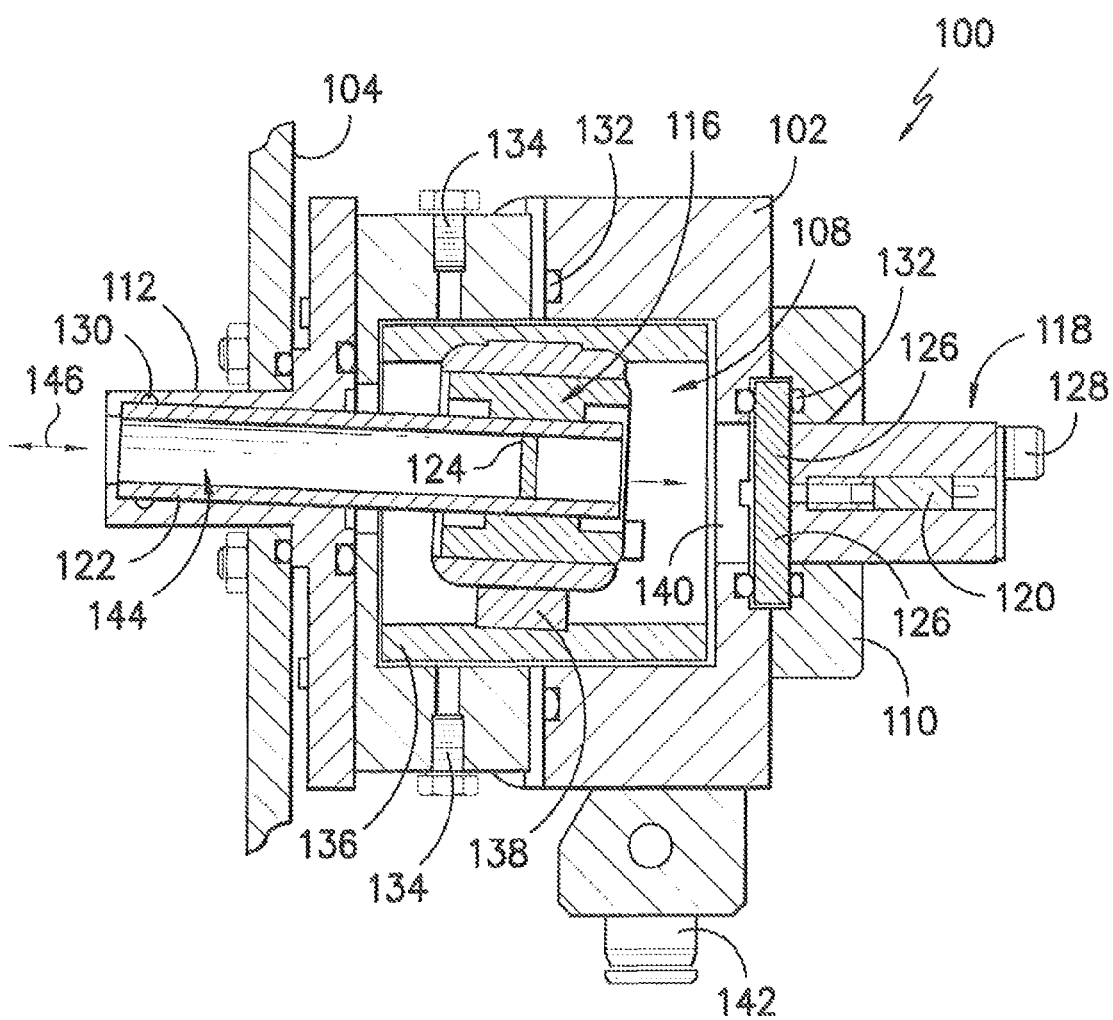
FIG. —4—

ACTIVE VIEWPORT DETECTION ASSEMBLY FOR SUBSTRATE DETECTION IN A VAPOR DETECTION SYSTEM

FIELD OF THE INVENTION

The present invention relates generally to the field of thin film vapor deposition systems wherein a thin film layer, such as a semiconductor layer, is deposited on a substrate conveyed through the system. More particularly, the invention is related to a detection system that detects the presence of the substrates as they are moved through the vapor deposition system.

BACKGROUND OF THE INVENTION

Production of thin film photovoltaic (PV) modules (also referred to as "solar panels") typically involves conveyance of a substrate, such as a glass panel, into and out of a vapor deposition chamber wherein a thin film layer (generally recognized in the industry as less than 10 um) of a semiconductor material, such as cadmium telluride (CdTe), is deposited onto the surface of the substrate. The deposition process may be any known process, for example a close space sublimation (CSS) system or chemical vapor deposition (CVD) system.

Viewports or "windows" are typically provided in the walls of the deposition chambers or conveying structures of the deposition system for any number of reasons. For example, the viewports may provide a means for visual inspection of the process, or may be configured to provide an input to control equipment that controls various process parameters, such as conveyor speed, and the like. These conventional viewports are, however, typically formed from glass or a glass composition and are prone to condensation or build-up of the sublimated material from the deposition or conveyor chambers. This situation requires frequent shutdown of the system for removal and cleaning or replacement of the viewports.

Shuttered viewports are known in the industry to protect the viewports from exposure to the sublimated material. However, these devices are of limited use because the shutters must be closed to function, which renders the optical viewport inoperable.

Roll-film viewports are also known. These devices operate by providing a layer of transparent protective film over the viewport optics. The film material is provided in roll form and, as the film becomes obscured by condensate, the film is advance from the roll so that a "clean" section of film is positioned in front of the viewport optics. These devices, however, require periodic maintenance and shutdown of the deposition system to replace the film material.

It is also known to heat the viewports to reduce the condensate levels and extend the time between cleaning maintenance procedures. In this regard, various references describe heated viewports for deposition chambers or equipment. Reference is made, for example to U.S. Pat. Nos. 5,129,994; 5,977,526 and 6,367,415. The heated viewports described in these references, however, are not particularly well suited for active sensing systems and have limited functionality.

Accordingly, there exists a need for an improved viewport detection assembly that is particularly suited for active detection of substrates conveyed through a vapor deposition system. The present invention relates to a heated viewport assembly that serves this purpose.

BRIEF DESCRIPTION OF THE INVENTION

Aspects and advantages of the invention will be set forth in part in the following description, or may be obvious from the description, or may be learned through practice of the invention.

In accordance with aspects of the invention, and embodiment of an active viewport assembly is provided for use in detecting substrates conveyed through a vapor deposition system. The viewport assembly includes a casing configured for mounting to a wall of a vapor deposition module, for example to a side wall or top wall of the module. The casing further comprises an enclosed chamber, an exterior side port, and an interior side port. When mounted to a wall of a vapor deposition module, the exterior side port is external to the module and the interior side port is in communication with the interior of the module. For example, the module may be mounted to the outside surface of the module, with the interior side port extending through the wall and into the module. The assembly further includes a lens assembly disposed within the chamber and extending into the interior side port such that the lens assembly is exposed to conditions within the module. A heater element is configured on the lens assembly within the chamber. For example, the heater element may be circumferentially mounted around the portion of the lens assembly that extends into the chamber. One of an active transmitter or an active signal receiver is configured with the exterior side port external of the chamber. This active component is spaced from and axially aligned with the lens assembly. In this configuration, with an active transmitter at the exterior port, an active signal is transmitted into the chamber, through the lens assembly, and out of the interior port. With the configuration wherein a receiver is at the exterior port, an active signal is conveyed through the interior port and lens assembly, into the chamber, and received by the receiver.

Variations and modifications to the embodiment of the viewport assembly discussed above are within the scope and spirit of the invention and may be further described herein.

The invention also encompasses various embodiments of a module that may be used in a vapor deposition system, wherein substrates are conveyed through the module. The module includes a housing having first and second walls. These walls may be opposite walls, such as opposite side walls or top and bottom walls. An interior conveyor is housed within the module and is configured for transport of substrates through the housing. A first viewport assembly is mounted in the first side wall, and a second viewport assembly is mounted in the second side wall. One or both of these viewport assemblies may be configured as discussed above. In a particular embodiment, each of the viewport assemblies includes a casing mounted to a module wall, with the casing further having an enclosed chamber, an exterior side port, and an interior side port that extends through the respective wall. The viewport assemblies further include a lens assembly disposed within the chamber and extending through the interior side port. A heater element is configured on the lens assembly within the chamber. The first viewport assembly has an active transmitter configured with the exterior side port to transmit an active signal into the chamber, through the lens assembly, and into the module housing towards the second side wall. The second viewport assembly mounted to the opposite second side wall includes a receiver configured with the exterior side port to receive the active signal, which is conveyed through the interior port and lens assembly, through the chamber, and received by the receiver.

Variations and modifications to the embodiment of the vapor deposition module discussed above are within the scope and spirit of the invention and may be further described herein.

These and other features, aspects and advantages of the present invention will become better understood with reference to the following description and appended claims.

BRIEF DESCRIPTION OF THE DRAWING

A full and enabling disclosure of the present invention, including the best mode thereof, is set forth in the specification, which makes reference to the appended drawings, in which:

FIG. 1 is a plan view of a vapor deposition system that may incorporate embodiments of viewport assemblies in accordance with the present invention;

FIG. 2 is a top view of conveyor modules that incorporate embodiments of viewport assemblies in accordance with the present invention;

FIG. 3 is a side cut-away view of the one of the conveyor modules depicted in FIG. 2; and, FIG. 4 is a cut-away view of a particular embodiment of a viewport assembly.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIG. 1 illustrates an embodiment of a vapor deposition system 10 that may incorporate viewport assemblies 100 in accordance with aspects of the invention, particularly as components of various types of modules that make up the system 10. For reference and an understanding of an environment in which the present viewport assemblies 100 may be used, the system 10 of FIG. 1 is described below, followed by a detailed description of particular embodiments of the viewport assemblies 100.

The system 10 is configured for deposition of a thin film layer on a photovoltaic (PV) module substrate 14 (referred to hereafter as "substrate"). The thin film may be, for example, a film layer of cadmium telluride (CdTe). As mentioned, it is generally recognized in the art that a "thin" film layer on a PV module substrate is generally less than about 10 microns (um). It should be appreciated that the viewport assemblies 100 are not limited to use in the system 10 illustrated in FIG. 1, but may be incorporated into any suitable processing line configured for vapor deposition of a thin film layer onto a substrate, such as a PV module substrate 14.

Referring to FIG. 1, the exemplary system 10 includes a vacuum chamber 12 defined by a plurality of interconnected modules. A plurality of interconnected heater modules 16 define a pre-heat section of the vacuum chamber 12 through which the substrates 14 are conveyed and heated to a desired temperature before being conveyed into a vapor deposition apparatus 60, which may also be a self-contained module. Each of the heater modules 16 may include a plurality of independently controlled heaters 18, with the heaters defining a plurality of different heat zones. A particular heat zone may include more than one heater 18.

The vapor deposition apparatus 60 may take on various configurations and operating principles within the scope and spirit of the invention, and is generally configured for vapor deposition of a sublimated source material, such as CdTe, as a thin film on the PV module substrates 14. In the embodiment of the system 10 illustrated in FIG. 1, the apparatus 60 is a module that includes a casing in which the internal components are contained, including a vacuum deposition head mounted above a conveyor assembly.

The vacuum chamber 12 also includes a plurality of interconnected cool-down modules 20 within the vacuum chamber 12 downstream of the vapor deposition apparatus 60. The cool-down modules 20 define a cool-down section within the vacuum chamber 12 in which the substrates 14 having the thin film of sublimed source material deposited thereon are allowed to cool at a controlled cool-down rate prior to the substrates 14 being removed from the system 10. Each of the modules 20 may include a forced cooling system wherein a cooling medium, such as chilled water, refrigerant, gas, or other medium is pumped through cooling coils configured with the modules 20.

In the illustrated embodiment of system 10, at least one post-heat module 22 is located immediately downstream of the vapor deposition apparatus 60 and before the cool-down modules 20. The post-heat module 22 maintains a controlled heating profile of the substrate 14 until the entire substrate is moved out of the vapor deposition apparatus 60 to prevent damage to the substrate, such as warping or breaking caused by uncontrolled or drastic thermal stresses. If the leading section of the substrate 14 were allowed to cool at an excessive rate as it exited the apparatus 60, a potentially damaging temperature gradient would be generated longitudinally along the substrate 14. This condition could result in breaking or cracking of the substrate from thermal stress.

As diagrammatically illustrated in FIG. 1, a feed device 24 is configured with the vapor deposition apparatus 60 to supply source material, such as granular CdTe. Preferably, the feed device 24 is configured so as to supply the source material without interrupting the continuous vapor deposition process within the apparatus 60 or conveyance of the substrates 14 through the apparatus 60.

Still referring to FIG. 1, the individual substrates 14 are initially placed onto a load conveyor 26, and are subsequently moved into an entry vacuum lock station that includes a load module 28 and a buffer module 30. A "rough" (i.e., initial) vacuum pump 32 is configured with the load module 28 to drawn an initial vacuum, and a "fine" (i.e., high) vacuum pump 38 is configured with the buffer module 30 to increase the vacuum in the buffer module 30 to essentially the vacuum within the vacuum chamber 12, which is maintained by any combination of rough and fine vacuum pumps 40. Valves 34 (e.g., gate-type slit valves or rotary-type flapper valves) are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 into the vacuum chamber 12 in a step-wise manner without affecting the vacuum within the chamber 12.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and valves 34 are sequentially operated to move the substrates 14 out of the vacuum chamber 12 in a step-wise fashion without loss of vacuum condition within the vacuum chamber 12.

System 10 also includes a conveyor system configured to move the substrates 14 into, through, and out of the vacuum chamber 12 and the entry and exit vacuum lock station modules (26, 28, 30, 42, 44, 46). In the illustrated embodiment, this conveyor system includes a plurality of individually controlled conveyors 48, with each of the various modules including one of the conveyors 48. It should be appreciated that the type or configuration of the conveyors 48 in the various modules may vary. In the illustrated embodiment, the conveyors 48 are roller conveyors having driven rollers that are controlled so as to achieve a desired conveyance rate of the substrates 14 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as illustrated in FIG. 1. The central system controller 52 can monitor and control (via the independent controllers 50) the functions of any one of the modules so as to achieve an overall desired heat-up rate, deposition rate, cool-down rate, and so forth, in processing of the substrates 14 through the system 10.

Referring to FIG. 1, for independent control of the functions performed by the modules within the overall system configuration 10, including for example individual control of the respective conveyors 48, opening and closing of the gate valves 34, and so forth, the modules include active-sensing viewport assemblies 100 that detect the presence of the substrates 14 as they are conveyed through the module. The assemblies 100 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired constant conveyance rate through the vacuum chamber 12. It should be appreciated that the viewport assemblies may be used for any other control function related to the individual modules or overall system 10.

FIGS. 2 and 3 illustrate a system wherein various viewport assemblies 100 are configured with the respective conveyor systems 48 of a plurality of adjacent modules, such as the modules discussed above with respect to FIG. 1. In this particular embodiment, the conveyor systems 48 include a plurality of adjacently disposed rollers 144 that are used to convey substrates 14 in a conveyance direction, as indicated by the arrows in FIG. 2. Referring to FIG. 3, a viewport assembly 100 is mounted onto each of the opposite side walls 106 of a respective module. These viewport assemblies may, in alternate embodiments, be mounted to the top and bottom walls of the module, or to a top or bottom wall and an adjacent side wall.

Referring still to FIG. 3, a first set of the viewport assemblies 100 may be provided at the entry end of a module, and a second set of the viewport assemblies 100 may be provided at the exit end of each module, as illustrated in FIG. 2. These sets of viewport assemblies 100 may be spaced apart a distance that is essentially the same as or slightly less than the length of one of the substrates 14 conveyed through the system.

As depicted in FIG. 3, the opposed viewport assemblies 100 may be disposed at upper and lower vertical positions on their respective walls such that a sensing axis 146 between the assemblies 100 traverses the horizontal plane of the conveyor 48. For example, in the embodiment wherein the conveyor consists of a plurality of adjacently disposed rollers 144 with a space between the individual rollers, the viewport assemblies 100 may be positioned so that the sensing axis 146 extends through the space between two adjacent rollers, as particularly illustrated in FIG. 2. Thus, referring to FIG. 3, it can be readily appreciated that the presence of a substrate 14 may block or deflect the active signal that is transmitted/received between the viewport assemblies 100. In this particular configuration, the absence of a received signal by the assembly 100 configured with an active signal receiver is an indication that a substrate is positioned at the location of the assemblies 100. As the substrate 14 moves linearly beyond the position of the viewport assemblies 100, the active signal will transmit/receive along the axis line 146 between the assemblies 100, thereby indicating that the substrate has moved and is no longer at the position of the assemblies 100. This transmitted/received signal will result when there is a space between adjacent ends of the serially conveyed substrates 14, and the length or duration of the signal may be an indication of proper spacing between the substrates 14. If the signal indicates that the spacing between adjacent substrates 14 is too little or too great, then the control system 50 for the individual module may adjust the driving speed of the respective conveyor system 48 for that particular module to adjust the spacing. The senses axis 146 is non-horizontal in that it is transverse to (i.e., crosses) the horizontal plane of the conveyor (or substrate 14 carried on the conveyor).

Still referring to FIG. 3, it should be appreciated that the transverse, non-horizontal sensing axis 146 may be achieved by various means. For example, the viewport assemblies 100 may be mounted relative to the module side walls 106, or to a side wall 106 and a top or bottom wall, at an angle so as to achieve the transverse sensing axis 146. In the embodiment illustrated in FIG. 3, the viewport assemblies 100 are mounted flush and vertical against the side walls 106, with the internal optics being disposed at a non-horizontal angle so as to achieve the non-horizontal sensing axis 146, as described in greater detail below by reference to the embodiment illustrated in FIG. 4.

FIG. 4 illustrates an embodiment of a viewport assembly 100 that includes a casing structure 102 that may be defined by any combination of housing or structural components. In this particular embodiment, the casing 102 includes a number of components that may be configured with seals 132 between the various components. The casing is configured for mounting to a wall 104 of a vapor deposition module, such as any one of the modules discussed above with respect to FIG. 1. The viewport assemblies 100 are not limited to any particular location on a module. For example, a pair of the viewport assemblies 100 may be configured with the top and bottom walls of a module, or the side walls 106 of a module, as depicted in FIGS. 2 and 3.

The casing 102 defines an internal chamber 108. This chamber 108 may function as a secondary vacuum confinement chamber in the event of a vacuum leak into the casing 102, as discussed in greater detail below.

The casing 102 further includes an exterior side port 110. This port 110 is "exterior" in that it is located on the exterior side of the wall 104 to which it is attached. The exterior side port 110 is configured with a recess 140 for receipt of any suitable manner of active transmitter or receiver 118. In the illustrated embodiment, this transmitter/receiver 118 may be, for example, a fiber optic transmitter or receiver 120 that transmits or receives a fiber optic signal into or out of the chamber 108. A lens 126, which may be a focusing lens, may be configured within the exterior side port 110 to aid in the transmission or receipt of the respective active signal. This lens 126 may be positioned between seals 132.

The viewport assembly 100 includes a lens assembly 114 having a first end or portion that is disposed within the chamber 108. The opposite end of the lens assembly 114 is received within an interior side port 112 of the casing 102. This port is "interior" in that it extends through the module wall 104 to which the casing 102 is mounted and into the interior of the module, and is thus exposed to the conditions within the module. In this regard, the interior side port 112 may include an elongated tubular shape having a length sufficient to extend through the wall 104 and into the interior of the module. In the illustrated embodiment, the lens assembly 114 includes an elongated tube 122 that is fitted into and sealed to the interior surface of the side port 112 via an elastomeric circumferential seal 130. In a particular embodiment, the tube 122 may be a quartz tubular element.

A lens 124 is disposed within the tube 122 generally adjacent to the end of the tube 122 that is located within the chamber 108. This lens 124 may serve to focus the active signal that is received or transmitted by the active element 118 (receiver or transmitter). It should be appreciated that the interior of the tube 122 is exposed to the vacuum deposition conditions within the module to which the assembly is mounted. In this regard, the sublimated source material may diffuse into the tube 122 and tend to plate onto the lens 124, which in time would render the assembly 100 inoperable. To prevent condensation of the sublimated source material onto the lens 124, a heater element 116 is operably disposed within the chamber 108 on the lens assembly 114. In a particular embodiment illustrated in FIG. 4, the heater element 116 includes a circumferential ring heater 138 that encircles the tube 122 around a portion of the length of the tube that includes the lens 124. This ring heater 138 may be, for example, a resistive heater, or any other suitable heating mechanism. Heat is supplied to the end of the lens assembly 114 that includes the lens 124, which is maintained at a temperature effective for preventing sublimated source material from plating onto the lens 124.

The tube 122 has a sufficient axial length such that the elastomeric seal 130 is at a sufficient axial distance from the heater element 116 to prevent damage the seal 130. It should be recognized that a defective seal between the tube 122 and the interior side port 112 would result in a vacuum breach. However, even if this were to occur, the chamber 108 would essentially act as a secondary vacuum chamber to contain any vacuum leak through the interior side port 112. In this case, the seals cooperating with a secondary lens 126 associated with the active element 118 would constitute an additional vacuum barrier.

In order to periodically determine whether a vacuum leak has occurred into the assembly 100, any configuration of vacuum check ports 134 may be provided in the casing 102.

As discussed above with respect to the embodiments of FIGS. 2 and 3, it may be desired to dispose opposite ones of a pair of the assemblies 100 so as to transmit/receive an active signal that is transverse and non-horizontal with respect to the horizontal plane of a conveyor within a module, as particularly illustrated in FIG. 3. Referring to FIG. 4, this may be accomplished by orienting the lens assembly 114 within the chamber 108 and interior side port 112 at a non-horizontal angle. The interior side port 112 may include an angled bore for receipt of the tube 122, with the opposite end of the tube 122 being angularly disposed within the ring heater 138. The ring heater 138 may also be angularly disposed within the chamber 108 via any suitable structure or insulating material 136, or the like. This particular embodiment is advantageous in that it allows for relatively flush mounting of the casing 102 relative to a wall 104, yet allows for a non-horizontal sensing axis 146 relative to the interior of the module.

It should be appreciated that the viewport assembly 100 is not limited to any particular sensing principle, and may be configured with any type of active sensor or receiver, such as a radio frequency (RF) system, laser system, fiber optic system, and the like. The active sensing component 118 (either a receiver or a transmitter) may include a port 128 for supply of power and for conducting signals from or to the active element 118. The active element 118 may be removably received within the recess 140 provided in the exterior port 110 so that the active element can be replaced or serviced without having to remove the assembly 100 from the wall 104. A secondary lens 126 may be operably disposed within the exterior port 110 with seals 132. This configuration permits removal of the active component 118 from the exterior port 110 while maintaining vacuum integrity of the chamber 108.

Power for the heater element 116, for example the ring heater 138, may be supplied through a port 142 that is located at any suitable position relative to the casing 102.

The present invention also encompasses a module for use in a vapor deposition system, such as any one of the modules discussed above with respect to FIG. 1 that includes one or more of the viewport assemblies 100 in accordance with the invention. For example, such a module may include a housing defining an internal vacuum space, with the housing comprising first and second side walls 106, as depicted in FIG. 3. An interior conveyor is housed within the module. In the illustrated embodiment, this conveyor includes a plurality of rollers 144 that extend between the module side walls for transport of a substrate 14 through the module housing. Various embodiments of a viewport assembly 100 in accordance with aspects of the invention may be configured on the walls 106 (or in the top and bottom walls) in order to sense the presence or absence of a substrate within the module at the particular location of the assemblies 100.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An active viewport assembly for use in detecting substrates conveyed through a vapor deposition system, said viewport assembly comprising:
   a casing configured for mounting to a wall of a vapor deposition module, said casing further comprising an enclosed chamber, an exterior side port, and an interior side port;
   a lens assembly disposed within said chamber and extending through said interior side port;

a heater element configured on said lens assembly within said chamber; and, one of an active transmitter or an active signal receiver configured with said exterior side port external of said chamber, said transmitter or receiver axially aligned with and spaced from said lens assembly.

2. The viewport assembly as in claim 1, wherein said lens assembly comprises a tube and a lens disposed within said tube at a location within said chamber, said heater element disposed concentric around said tube so as to surround said lens.

3. The viewport assembly as in claim 2, further comprising an elastomeric seal disposed between said tube and said interior side port, said seal spaced from said heater element a distance sufficient to prevent thermal damage to said seal.

4. The viewport assembly as in claim 1, wherein said interior port has an axial length sufficient so as to extend through the wall in the vapor deposition module on which said viewport assembly is mounted, said lens assembly comprising a tube disposed with said interior port and a lens disposed within said tube at a location so as to be within said chamber.

5. The viewport assembly as in claim 1, comprising an active transmitter configured with said exterior side port to transmit an active signal into said chamber, through said lens assembly, and into the vapor deposition module.

6. The viewport assembly as in claim 1, comprising an active signal receiver configured with said exterior side port and aligned to receive an active signal conducted into said lens assembly, through said chamber, and through said exterior side port.

7. The viewport assembly as in claim 1, further comprising a leak check port in communication with said chamber.

8. The viewport assembly as in claim 1, wherein said lens assembly is disposed at a non-horizontal angle relative to said casing so as to receive or transmit a non-horizontal signal transmitted through a vapor deposition module in which said viewport assembly is mounted that crosses a horizontal plane of a substrate conveyed through the vapor deposition module.

9. A module for use in a vapor deposition system, wherein substrates are conveyed through said module, said module comprising:

a housing, said housing comprising first and second walls;

an interior conveyor within said housing and configured for transport of a substrate through said housing;

a first viewport assembly mounted on said first wall, said first viewport assembly further comprising a casing mounted to said first wall, said casing further comprising an enclosed chamber, an exterior side port, and an interior side port that extends through said respective wall;

a lens assembly disposed within said chamber and extending through said interior side port;

a heater element configured on said lens assembly within said chamber; and, one of an active transmitter or an active signal receiver configured with said exterior side port external of said chamber, said transmitter or receiver axially aligned with and spaced from said lens assembly.

10. The module as in claim 9, further comprising a second viewport assembly mounted to said second wall, said second viewport assembly further comprising:

a casing mounted to said second wall, said casing further comprising an enclosed chamber, an exterior side port, and an interior side port that extends through said second wall;

a lens assembly disposed within said chamber and extending through said interior side port;

a heater element configured on said lens assembly within said chamber; and, one of an active transmitter or an active signal receiver configured with said exterior side port external of said chamber, said transmitter or receiver axially aligned with and spaced from said lens assembly;

wherein an active signal is conveyed between said first and second viewport assemblies, the active signal passing through said interior side port, said chamber, and said lens assembly of each of said first and second viewport assemblies.

11. The module as in claim 10, wherein said lens assembly in said first and second viewport assemblies comprises a tube and a lens disposed within said tube at a location within said chamber, said heater element disposed concentric around said tube so as to surround said lens.

12. The module as in claim 11, further comprising an elastomeric seal disposed between said tube and said interior side port in said first and second viewport assemblies, said seal spaced from said heater element a distance sufficient to prevent thermal damage to said seal.

13. The module as in claim 10, wherein said interior port in each of said first and second viewport assemblies has an axial length sufficient so as to extend through said respective wall, said lens assemblies comprising a tube disposed with said interior port and a lens disposed within said tube at a location within said chamber.

14. The module as in claim 10, wherein said first and second viewport assemblies comprise a leak check port in communication with said chamber.

15. The module as in claim 10, wherein said first and second viewport assemblies are disposed in a non-horizontal plane relative to said first and second walls such that said active signal crosses a horizontal plane of said conveyor within said housing.

16. The module as in claim 15, wherein said conveyor comprises a plurality of spaced apart rollers, said first and second viewport assemblies disposed so that said active signal passes through said conveyor between adjacent said rollers.

* * * * *